(12) United States Patent
Kim

(10) Patent No.: US 11,356,096 B2
(45) Date of Patent: Jun. 7, 2022

(54) LOGIC CIRCUIT

(71) Applicant: SK hynix Inc., Icheon-si Gyeonggi-do (KR)

(72) Inventor: Chang Hyun Kim, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/028,716

(22) Filed: Sep. 22, 2020

(65) Prior Publication Data

US 2021/0384909 A1 Dec. 9, 2021

(30) Foreign Application Priority Data

Jun. 8, 2020 (KR) .................. 10-2020-0069090

(51) Int. Cl.
*H03K 19/20* (2006.01)
*H03K 19/0948* (2006.01)

(52) U.S. Cl.
CPC ......... *H03K 19/0948* (2013.01); *H03K 19/20* (2013.01)

(58) Field of Classification Search
CPC .................... H03K 19/0948; H03K 19/20
See application file for complete search history.

(56) References Cited

U.S. PATENT DOCUMENTS

| 7,557,614 B1 * | 7/2009 | Bonsels | H03K 19/215 326/54 |
| 2007/0008014 A1 * | 1/2007 | Parris | H03K 19/215 326/121 |

FOREIGN PATENT DOCUMENTS

| KR | 1020080060375 A | 7/2008 |
| KR | 1020170126882 A | 11/2017 |

* cited by examiner

*Primary Examiner* — Kurtis R Bahr
(74) *Attorney, Agent, or Firm* — William Park & Associates Ltd.

(57) ABSTRACT

A logic circuit includes a first pull-up driving circuit configured to drive a first inverted input signal to a supply voltage based on a first input signal, and configured to pull up an output signal based on the first input signal, a second input signal, and a third inverted input signal. The logic circuit also includes a first pull-down driving circuit configured to drive the third inverted input signal to a ground voltage based on the third input signal, and configured to pull down the output signal based on the first inverted input signal, the second input signal, and the third input signal.

5 Claims, 16 Drawing Sheets

FIG.3

| IN1 | IN2 | IN3 | OUT |
|-----|-----|-----|-----|
| 0 | 0 | 1 | 1 |
| 0 | 1 | 1 | 0 |

FIG.6

| IN1 | IN2 | IN3 | OUT |
|-----|-----|-----|-----|
| 1 | 0 | 0 | 1 |
| 1 | 0 | 1 | 0 |

FIG.9

| IN1 | IN2 | IN3 | OUT |
|---|---|---|---|
| 0 | 1 | 0 | 1 |
| 1 | 1 | 0 | 0 |

FIG.12

| IN1 | IN2 | IN3 | OUT |
|-----|-----|-----|-----|
| 1 | 1 | 1 | 1 |
| 0 | 0 | 0 | 0 |

FIG.13

| IN1 | IN2 | IN3 | OUT |
|-----|-----|-----|-----|
| 0 | 0 | 1 | 1 |
| 0 | 1 | 1 | 0 |
| 1 | 0 | 0 | 1 |
| 1 | 0 | 1 | 0 |
| 0 | 1 | 0 | 1 |
| 1 | 1 | 0 | 0 |
| 1 | 1 | 1 | 1 |
| 0 | 0 | 0 | 0 |

LOGIC CIRCUIT

CROSS-REFERENCES TO RELATED APPLICATION

The present application claims priority under 35 U.S.C. § 119(a) to Korean application number 10-2020-0069090, filed on Jun. 8, 2020, which is incorporated by reference in its entirety.

BACKGROUND

1. Technical Field

Various embodiments generally relate to a logic circuit which performs a logic operation.

2. Related Art

An electronic device, such as a semiconductor device, changes all internal data into binary numbers in order to process the data. The electronic device uses various logic circuits which operate according to an electronic signal which has a logic low level and a logic high level to express a binary number.

SUMMARY

Various embodiments are directed to a logic circuit which performs a logic operation.

In an embodiment, a logic circuit may include a first pull-up driving circuit configured to drive a first inverted input signal to a supply voltage based on a first input signal, and configured to pull up an output signal based on the first input signal, a second input signal, and a third inverted input signal. The logic circuit may also include a first pull-down driving circuit configured to drive the third inverted input signal to a ground voltage based on the third input signal, and configured to pull down the output signal based on the first inverted input signal, the second input signal, and the third input signal.

In an embodiment, a logic circuit may include a first pull-up driving circuit configured to generate a first inverted input signal by inverting and buffering a first input signal, and configured to pull up an output signal to the first inverted input signal based on a second input signal and a third inverted input signal. The logic circuit may also include a first pull-down driving circuit configured to generate the third inverted input signal by inverting and buffering a third input signal, and configured to pull down the output signal to the third inverted input signal based on the first inverted input signal and the second input signal.

In an embodiment, a logic circuit may include: a first pull-up driving circuit configured to generate a first inverted input signal based on a first input signal, and configured to pull up an output signal based on the first inverted input signal, a second input signal, and a third inverted input signal; a first pull-down driving circuit configured to generate the third inverted input signal based on the third input signal, and configured to pull down the output signal based on a third inverted input signal, the second input signal, and the first inverted input signal; a second pull-up driving circuit configured to generate a second inverted input signal based on the second input signal, and configured to pull up the output signal based on the second inverted input signal, the third input signal, and the first inverted input signal; a second pull-down driving circuit configured to pull down the output signal based on the first inverted input signal, the third input signal, and the second inverted input signal; a third pull-up driving circuit configured to pull up the output signal based on the third inverted input signal, the first input signal, and the second inverted input signal; a third pull-down driving circuit configured to pull down the output signal based on the second inverted input signal, the first input signal, and the third inverted input signal; a fourth pull-up driving circuit configured to pull up the output signal based on the first inverted input signal, the second inverted input signal, and the third inverted input signal; and a fourth pull-down driving circuit configured to pull down the output signal based on the first inverted input signal, the second inverted input signal, and the third inverted input signal.

In accordance with some embodiments, the logic circuit which pulls up or down an output signal according to a logic level combination of input signals can be implemented to rapidly perform a logic operation.

Furthermore, for some embodiments, only the driving circuits which pull up or down an output signal according to a logic level combination of input signals may be used to implement a logic circuit, thereby minimizing a layout area.

BRIEF DESCRIPTION OF THE DRAWINGS

FIG. 3 is a table for describing operations of the first pull-up driving circuit and the first pull-down driving circuit which are illustrated in FIG. 2.

FIG. 6 is a table for describing operations of the second pull-up driving circuit and the second pull-down driving circuit which are illustrated in FIG. 5.

FIG. 9 is a table for describing operations of the third pull-up driving circuit and the third pull-down driving circuit which are illustrated in FIG. 8.

FIG. 12 is a table for describing operations of the fourth pull-up driving circuit and the fourth pull-down driving circuit which are illustrated in FIG. 11.

FIG. 13 is a table for describing an operation of the logic circuit illustrated in FIG. 1.

DETAILED DESCRIPTION

In the descriptions of the following embodiments, the term "preset" indicates that the value of a parameter is previously decided, when the parameter is used in a process or algorithm. According to different embodiments, the value of the parameter may be set when the process or algorithm is started or while the process or algorithm is performed.

The terms such as "first" and "second," which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having a "logic high level" is distinguished from a signal having a "logic low level." For example, when a signal having a first voltage corresponds to a "logic high level," a signal having a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, embodiments will be described in more detail. The embodiments are only used to exemplify the present disclosure, and the scope of the present disclosure is not limited by the embodiments.

Figure 1:
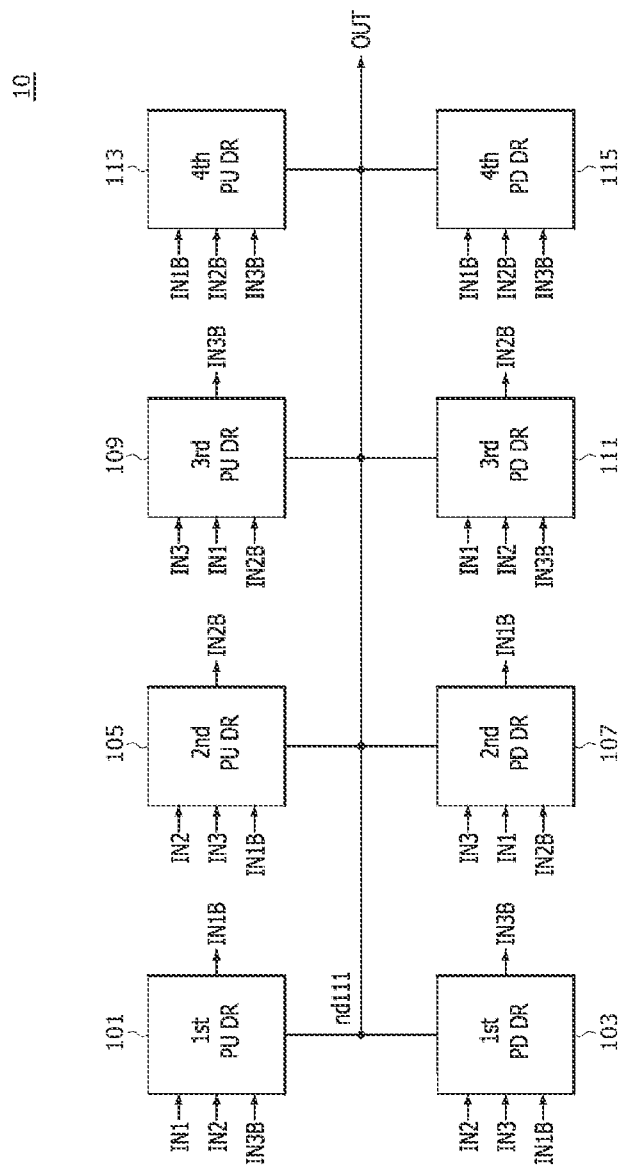
FIG. 1 is a block diagram illustrating a configuration of a logic circuit in accordance with an embodiment.

As illustrated in FIG. 1, a logic circuit 10 in accordance with an embodiment may include a first pull-up driving circuit (1st PU DR) 101, a first pull-down driving circuit (1st PD DR) 103, a second pull-up driving circuit (2nd PU DR) 105, a second pull-down driving circuit (2nd PD DR) 107, a third pull-up driving circuit (3rd PU DR) 109, a third pull-down driving circuit (3rd PD DR) 111, a fourth pull-up driving circuit (4th PU DR) 113, and a fourth pull-down driving circuit (4th PD DR) 115.

The first pull-up driving circuit 101 may pull up an output signal OUT outputted to a node nd111, based on a first input signal IN1, a second input signal IN2, and a third inverted input signal IN3B. Here, 'pulling up' may indicate driving the output signal OUT to a logic high level using a supply voltage (VDD of FIG. 2). The first pull-up driving circuit 101 may pull up the output signal OUT to a second logic level, when the first input signal IN1, the second input signal IN2, and the third inverted input signal IN3B are at a first logic level. The first logic level may be set to a logic low level, and the second logic level may be set to a logic high level.

The first pull-down driving circuit 103 may pull down the output signal OUT outputted to the node nd111, based on the second input signal IN2, a third input signal IN3, and a first inverted input signal IN1B. Here, 'pulling down' may indicate driving the output signal OUT to a logic low level using a ground voltage (VSS of FIG. 2). The first pull-down driving circuit 103 may pull down the output signal OUT to the first logic level, when the second input signal IN2, the third input signal IN3, and the first inverted input signal IN1B are at the second logic level. The first logic level may be set to a logic low level, and the second logic level may be set to a logic high level.

The second pull-up driving circuit 105 may pull up the output signal OUT outputted to the node nd111, based on the second input signal IN2, the third input signal IN3, and the first inverted input signal IN1B. The second pull-up driving circuit 105 may pull up the output signal OUT to the second logic level, when the second input signal IN2, the third input signal IN3, and the first inverted input signal IN1B are at the first logic level.

The second pull-down driving circuit 107 may pull down the output signal OUT outputted to the node nd111, based on the third input signal IN3, the first input signal IN1, and a second inverted input signal IN2B. The second pull-down driving circuit 107 may pull down the output signal OUT to the first logic level, when the third input signal IN3, the first input signal IN1, and the second inverted input signal IN2B are at the second logic level.

The third pull-up driving circuit 109 may pull up the output signal OUT outputted to the node nd111, based on the third input signal IN3, the first input signal IN1, and the second inverted input signal IN2B. The third pull-up driving circuit 109 may pull up the output signal OUT to the second logic level, when the third input signal IN3, the first input signal IN1, and the second inverted input signal IN2B are at the first logic level.

The third pull-down driving circuit 111 may pull down the output signal OUT outputted to the node nd111, based on the first input signal IN1, the second input signal IN2, and the third inverted input signal IN3B. The third pull-down driving circuit 111 may pull down the output signal OUT to the first logic level, when the first input signal IN1, the second input signal IN2, and the third inverted input signal IN3B are at the second logic level.

The fourth pull-up driving circuit 113 may pull up the output signal OUT outputted to the node nd111, based on the first inverted input signal IN1B, the second inverted input signal IN2B, and the third inverted input signal IN3B. The fourth pull-up driving circuit 113 may pull up the output signal OUT to the second logic level, when the first inverted input signal IN1B, the second inverted input signal IN2B, and the third inverted input signal IN3B are at the first logic level.

The fourth pull-down driving circuit 115 may pull down the output signal OUT outputted to the node nd111, based on the first inverted input signal IN1B, the second inverted input signal IN2B, and the third inverted input signal IN3B. The fourth pull-down driving circuit 115 may pull down the output signal OUT to the first logic level, when the first inverted input signal IN1B, the second inverted input signal IN2B, and the third inverted input signal IN3B are at the second logic level.

The logic circuit 10 in accordance with the present embodiment may pull up or pull down the output signal OUT according to the logic level combination of the first input signal IN1, the second input signal IN2, and the third input signal IN3, thereby rapidly performing an XOR operation. The logic circuit 10 in accordance with the present embodiment might include only the first pull-up driving circuit 101, the first pull-down driving circuit 103, the second pull-up driving circuit 105, the second pull-down driving circuit 107, the third pull-up driving circuit 109, the third pull-down driving circuit 111, the fourth pull-up driving circuit 113, and the fourth pull-!9 down driving circuit 115, in order to perform an XOR operation, which makes it possible to minimize a layout area.

Figure 2:
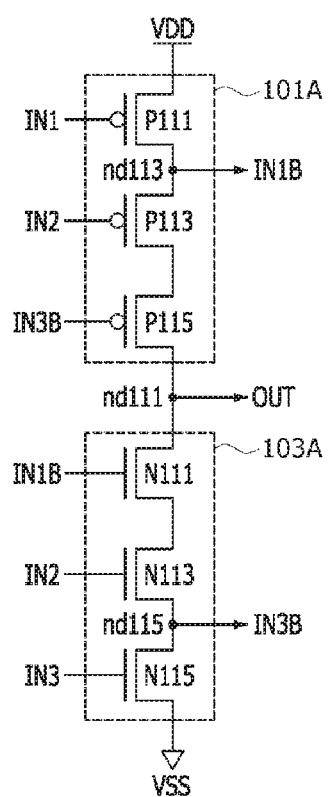
FIG. 2 is a circuit diagram illustrating an embodiment of a first pull-up driving circuit and a first pull-down driving circuit which are included in the logic circuit illustrated in FIG. 1.

FIG. 2 is a circuit diagram illustrating an embodiment of the first pull-up driving circuit 101 and the first pull-down driving circuit 103.

As illustrated in FIG. 2, a first pull-up driving circuit 101A implemented as an embodiment of the first pull-up driving circuit 101 may include p-type metal-oxide-semiconductor (PMOS) transistors P111, P113, and P115. The PMOS transistor P111 may be coupled between the terminal of the supply voltage VDD and a node nd113, and turned on based on the first input signal IN1. The PMOS transistor P111 may drive the first inverted input signal IN1B outputted to the node nd113 to the supply voltage VDD, when the first input signal IN1 is at a logic low level. The PMOS transistors P113 and P115 may be coupled in series between the node nd113 and the node nd111 from which the output signal OUT is outputted. The PMOS transistor P113 may be turned on when the second input signal IN2 is at a logic low level, and the PMOS transistor P115 may be turned on when the third inverted input signal IN3B is at a logic low level. The first pull-up driving circuit 101A may pull up the output signal OUT, outputted from the node nd111, to the supply voltage VDD through the PMOS transistors P111, P113, and P115 which are all turned on when the first input signal IN1, the second input signal IN2, and the third inverted input signal IN3B are all at a logic low level.

As illustrated in FIG. 2, a first pull-down driving circuit 103A implemented as an embodiment of the first pull-down driving circuit 103 may include n-type metal-oxide-semiconductor (NMOS) transistors N111, N113, and N115. The NMOS transistors N111 and N113 may be coupled in series between the node nd111 and a node nd115. The NMOS transistor N111 may be turned on when the first inverted input signal IN1B is at a logic high level, and the NMOS transistor N113 may be turned on when the second input signal IN2 is at a logic high level. The NMOS transistor N115 may be coupled between the terminal of the ground voltage VSS and the node nd115 from which the third inverted input signal IN3B is outputted. When the third input signal IN3 is at a logic high level, the NMOS transistor N115 may be turned on to pull down the third inverted input signal IN3B to the ground voltage VSS. The first pull-down driving circuit 103A may pull down the output signal OUT, outputted from the node nd111, to the ground voltage VSS through the NMOS transistors N111, N113, and N115 which are all turned on when the second input signal IN2, the third input signal IN3, and the first inverted input signal IN1B are all at a logic high level.

Figure 3:
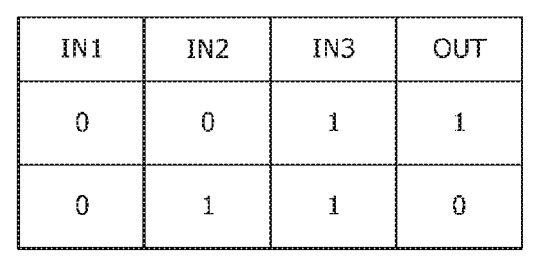

FIG. 3 is a table for describing the operations of the first pull-up driving circuit 101A and the first pull-down driving circuit 103A which are illustrated in FIG. 2. As illustrated in FIG. 3, the first pull-up driving circuit 101A may drive the output signal OUT to a logic high level, when the first input signal IN1 and the second input signal IN2 are all at a logic low level "0" and the third input signal IN3 is at a logic high level "1." As illustrated in FIG. 3, the first pull-down driving circuit 103A may drive the output signal OUT to a logic low level, when the first input signal IN1 is at a logic low level and the second input signal IN2 and the third input signal IN3 are all at a logic high level.

Figure 4:
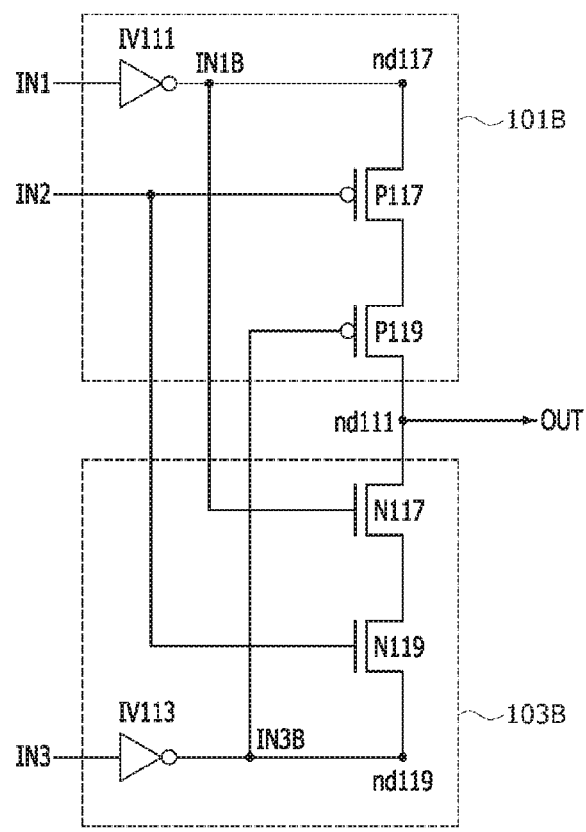
FIG. 4 is a circuit diagram illustrating another embodiment of the first pull-up driving circuit and the first pull-down driving circuit which are included in the logic circuit illustrated in FIG. 1.

FIG. 4 is a circuit diagram illustrating another embodiment of the first pull-up driving circuit 101 and the first pull-down driving circuit 103.

As illustrated in FIG. 4, a first pull-up driving circuit 101B implemented as another embodiment of the first pull-up driving circuit 101 may include an inverter IV111 and PMOS transistors P117 and P119. The inverter IV111 may invert and buffer the first input signal IN1, and output the first inverted input signal IN1B to a node nd117, The PMOS transistors P117 and P119 may be coupled in series between the node nd117 and the node nd111 from which the output signal OUT is outputted. The PMOS transistor P117 may be turned on when the second input signal IN2 is at a logic low level, and the PMOS transistor P119 may be turned on when the third inverted input signal IN3B is at a logic low level. The first pull-up driving circuit 101E may pull up the output signal OUT, outputted from the node nd111, to the first inverted input signal IN1B through the PMOS transistors P117 and P119 which are all turned on when the first input signal IN1, the second input signal IN2, and the third inverted input signal IN3B are all at a logic low level.

As illustrated in FIG. 4, a first pull-down driving circuit 103E implemented as another embodiment of the first pull-down driving circuit 103 may include an inverter IV113 and NMOS transistors N117 and N119. The inverter IV113 may invert and buffer the third input signal IN3, and output the third inverted input signal IN3B to a node nd119. The NMOS transistors N117 and N119 may be coupled in series between the nodes nd111 and nd119. The NMOS transistor N117 may be turned on when the first inverted input signal IN1B is at a logic high level, and the NMOS transistor N119 may be turned on when the second input signal IN2 is at a logic high level. The first pull-down driving circuit 103B may pull down the output signal OUT, outputted from the node nd111, to the third inverted input signal IN3B through the NMOS transistors N117 and N119 which are all turned on when the second input signal IN2, the third input signal IN3, and the first inverted input signal IN1B are all at a logic high level.

Figure 5:
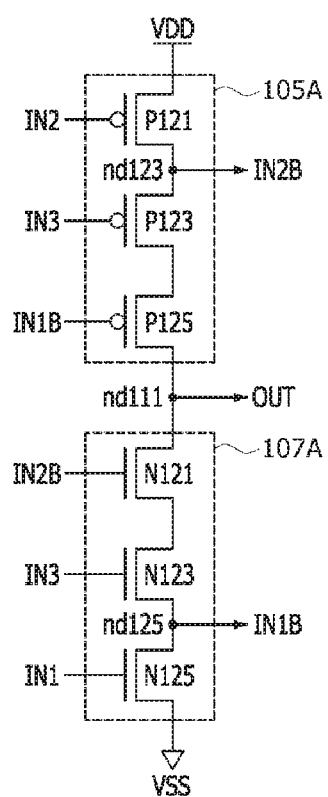
FIG. 5 is a circuit diagram illustrating an embodiment of a second pull-up driving circuit and a second pull-down driving circuit which are included in the logic circuit illustrated in FIG. 1.

FIG. 5 is a circuit diagram illustrating an embodiment of the second pull-up driving circuit 105 and the second pull-down driving circuit 107.

As illustrated in FIG. 5, a second pull-up driving circuit 105A implemented as an embodiment of the second pull-up driving circuit 105 may include PMOS transistors P121, P123, and P125. The PMOS transistor P121 may be coupled between the terminal of the supply voltage VDD and a node nd123, and turned on based on the second input signal IN2. The PMOS transistor P121 may drive the second inverted input signal IN2B outputted to the node nd123 to the supply voltage VDD, when the second input signal IN2 is at a logic low level. The PMOS transistors P123 and P125 may be coupled in series between the node nd123 and the node nd111 from which the output signal OUT is outputted. The PMOS transistor P123 may be turned on when the third input signal IN3 is at a logic low level, and the PMOS transistor P125 may be turned on when the first inverted input signal IN1B is at a logic low level. The second pull-up driving circuit 105A may pull up the output signal OUT, outputted from the node nd111, to the supply voltage VDD through the PMOS transistors P121, P123, and P125 which are all turned on when the second input signal IN2, the third input signal IN3 and the first inverted input signal IN1B are all at a logic low level.

As illustrated in FIG. 5, a second pull-down driving circuit 107A implemented as an embodiment of the second pull-down driving circuit 107 may include NMOS transistors N121, N123, and N125. The NMOS transistors N121 and N123 may be coupled in series between the node nd111 and a node nd125. The NMOS transistor N121 may be turned on when the second inverted input signal IN2B is at a logic high level, and the NMOS transistor N123 may be turned on when the third input signal IN3 is at a logic high level. The NMOS transistor N125 may be coupled between the terminal of the ground voltage VSS and the node nd125 from which the first inverted input signal IN1B is outputted. When the first input signal IN1 is at a logic high level, the NMOS transistor N125 may be turned on to pull down the first inverted input signal IN1B to the ground voltage VSS. The second pull-down driving circuit 107A may pull down the output signal OUT, outputted from the node nd111, to the ground voltage VSS through the NMOS transistors N121, N123, and N125 which are all turned on when the third input signal IN3, the first input signal IN1, and the second inverted input signal IN2B are all at a logic high level.

Figure 6:
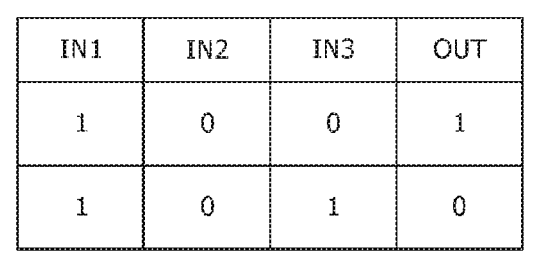

FIG. 6 is a table for describing the operations of the second pull-up driving circuit 105A and the second pull-down driving circuit 107A which are illustrated in FIG. 5. As illustrated in FIG. 6, the second pull-up driving circuit 105A may drive the output signal OUT to a logic high level, when the first input signal IN1 is at a logic high level "1" and the second input signal IN2 and the third input signal IN3 are all at a logic low level "0." As illustrated in FIG. 6, the second pull-down driving circuit 107A may drive the output signal OUT to a logic low level, when the second input signal IN2 is at a logic low level and the first input signal IN1 and the third input signal IN3 are all at a logic high level.

Figure 7:
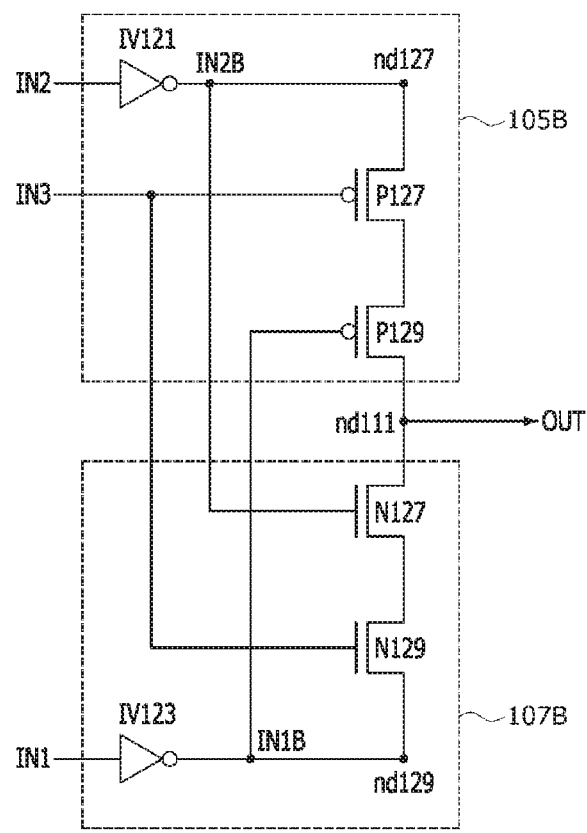
FIG. 7 is a circuit diagram illustrating another embodiment of the second pull-up driving circuit and the second pull-down driving circuit which are included in the logic circuit illustrated in FIG. 1.

FIG. 7 is a circuit diagram illustrating another embodiment of the second pull-up driving circuit 105 and the second pull-down driving circuit 107.

As illustrated in FIG. 7, a second pull-up driving circuit 105B implemented as another embodiment of the second pull-up driving circuit 105 may include an inverter IV121 and PMOS transistors P127 and P129. The inverter IV121 may invert and buffer the second input signal IN2, and output the second inverted input signal IN2B to a node nd127. The PMOS transistors P127 and P129 may be coupled in series between the node nd127 and the node nd111 from which the output signal OUT is outputted. The PMOS transistor P127 may be turned on when the third input signal IN3 is at a logic low level, and the PMOS transistor P129 may be turned on when the first inverted input signal IN1B is at a logic low level. The second pull-up driving circuit 105B may pull up the output signal OUT, outputted from the node nd111, to the logic high-level second inverted input signal IN2B through the PMOS transistors P127 and P129 which are all turned on when the second input signal IN2, the third input signal IN3, and the first inverted input signal IN1B are all at a logic low level.

As illustrated in FIG. 7, a second pull-down driving circuit 107B implemented as another embodiment of the second pull-down driving circuit 107 may include an inverter IV123 and NMOS transistors N127 and N129. The inverter IV123 may invert and buffer the first input signal IN1, and output the first inverted input signal IN1B to a node nd129. The NMOS transistors N127 and N129 may be coupled in series between the nodes nd111 and nd129. The NMOS transistor N127 may be turned on when the second inverted input signal IN2B is at a logic high level, and the NMOS transistor N129 may be turned on when the third input signal IN3 is at a logic high level. The second pull-down driving circuit 107B may pull down the output signal OUT, outputted from the node nd111, to the first inverted input signal IN1B through the NMOS transistors N127 and N129 which are all turned on when the third input signal IN3, the first input signal IN1, and the second inverted input signal IN2B are all at a logic high level.

Figure 8:
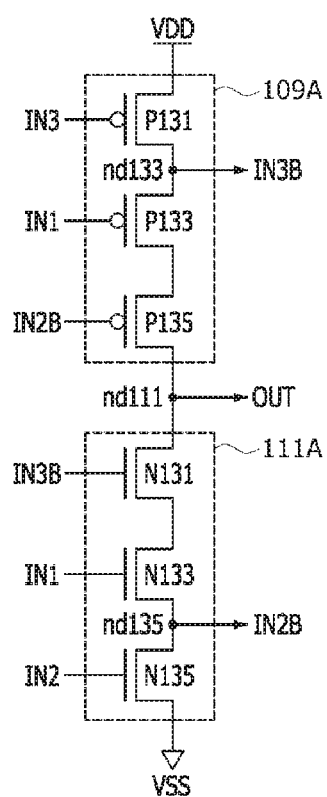
FIG. 8 is a circuit diagram illustrating an embodiment of a third pull-up driving circuit and a third pull-down driving circuit which are included in the logic circuit illustrated in FIG. 1.

FIG. 8 is a circuit diagram illustrating an embodiment of the third pull-up driving circuit 109 and the third pull-down driving circuit 111.

As illustrated in FIG. 8, a third pull-up driving circuit 109A implemented as an embodiment of the third pull-up driving circuit 109 may include PMOS transistors P131, P133, and P135. The PMOS transistor P131 may be coupled between the terminal of the supply voltage VDD and a node nd133, and turned on based on the third input signal IN3. The PMOS transistor P131 may drive the third inverted input signal IN3B outputted to the node nd133 to the supply voltage VDD, when the third input signal IN3 is at a logic low level. The PMOS transistors P133 and P135 may be coupled in series between the node nd133 and the node nd111 from which the output signal OUT is outputted. The PMOS transistor P133 may be turned on when the first input signal IN1 is at a logic low level, and the PMOS transistor P135 may be turned on when the second inverted input signal IN2B is at a logic low level. The third pull-up driving circuit 109A may pull up the output signal OUT, outputted from the node nd111, to the supply voltage VDD through the PMOS transistors P131, P133, and P135 which are all turned on when the third input signal IN3, the first input signal IN1, and the second inverted input signal IN2B are all at a logic low level.

As illustrated in FIG. 8, a third pull-down driving circuit 111A implemented as an embodiment of the third pull-down driving circuit 111 may include NMOS transistors N131, N133, and N135. The NMOS transistors N131 and N133 may be coupled in series between the node nd111 and a node nd135. The NMOS transistor N131 may be turned on when the third inverted input signal IN3B is at a logic high level, and the NMOS transistor N133 may be turned on when the first input signal IN1 is at a logic high level. The NMOS transistor N135 may be coupled between the terminal of the ground voltage VSS and the node nd135 from which the second inverted input signal IN2B is outputted. When the second input signal IN2 is at a logic high level, the NMOS transistor N135 may be turned on to pull down the second inverted input signal IN2B to the ground voltage VSS. The third pull-down driving circuit 111A may pull down the output signal OUT, outputted from the node nd111, to the ground voltage VSS through the NMOS transistors N131, N133, and N135 which are all turned on when the first input signal IN1, the second input signal IN2, and the third inverted input signal IN3B are all at a logic high level.

Figure 9:
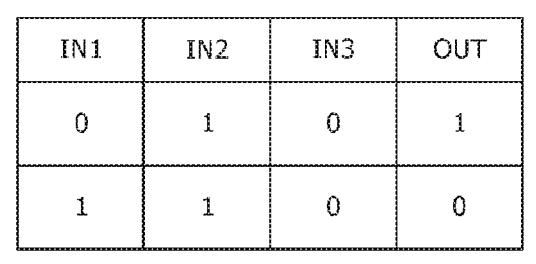

FIG. 9 is a table for describing the operations of the third pull-up driving circuit 109A and the third pull-down driving circuit 111A which are illustrated in FIG. 8. As illustrated in FIG. 9, the third pull-up driving circuit 109A may drive the output signal OUT to a logic high level, when the first input signal IN1 and the third input signal IN3 are all at a logic low level "0" and the second input signal IN2 is at a logic high level "1." As illustrated in FIG. 9, the third pull-down driving circuit 111A may drive the output signal OUT to a logic low level, when the first input signal IN1 and the second input signal IN2 are all at a logic high level and the third input signal IN3 is at a logic low level.

Figure 10:
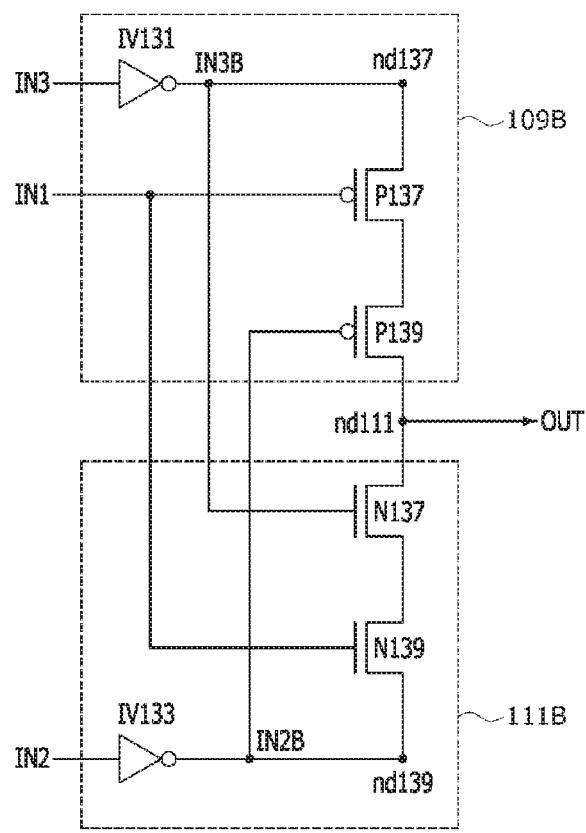
FIG. 10 is a circuit diagram illustrating another embodiment of the third pull-up driving circuit and the third pull-down driving circuit which are included in the logic circuit illustrated in FIG. 1.

FIG. 10 is a circuit diagram illustrating another embodiment of the third pull-up driving circuit 109 and the third pull-down driving circuit 111.

As illustrated in FIG. 10, a third pull-up driving circuit 109B implemented as another embodiment of the third pull-up driving circuit 109 may include an inverter IV131 and PMOS transistors P137 and P139. The inverter IV131 may invert and buffer the third input signal IN3, and output the third inverted input signal IN3B to a node nd137. The PMOS transistors P137 and P139 may be coupled in series between the node nd137 and the node nd111 from which the output signal OUT is outputted. The PMOS transistor P137 may be turned on when the first input signal IN1 is at a logic low level, and the PMOS transistor P139 may be turned on when the second inverted input signal IN2B is at a logic low level. The third pull-up driving circuit 109B may pull up the output signal OUT, outputted from the node nd111, to the logic high-level third inverted input signal IN3B through the NMOS transistors N137 and N139 which are all turned on when the third input signal IN3, the first input signal IN1, and the second inverted input signal IN2B are all at a logic low level.

As illustrated in FIG. 10, a third pull-down driving circuit 111B implemented as another embodiment of the third pull-down driving circuit 111 may include an inverter IV133 and NMOS transistors N137 and N139. The inverter IV133 may invert and buffer the second input signal IN2, and output the second inverted input signal IN2B to a node nd139. The NMOS transistors N137 and N139 may be coupled in series between the nodes nd111 and nd139. The NMOS transistor N137 may be turned on when the third inverted input signal IN3B is at a logic high level, and the NMOS transistor N139 may be turned on when the first input signal IN1 is at a logic high level. The third pull-down driving circuit 111E may pull down the output signal OUT, outputted from the node nd111, to the second inverted input signal IN2B through the NMOS transistors N137 and N139 which are all turned on when the first input signal IN1, the second input signal IN2, and the third inverted input signal IN3B are all at a logic high level.

Figure 11:
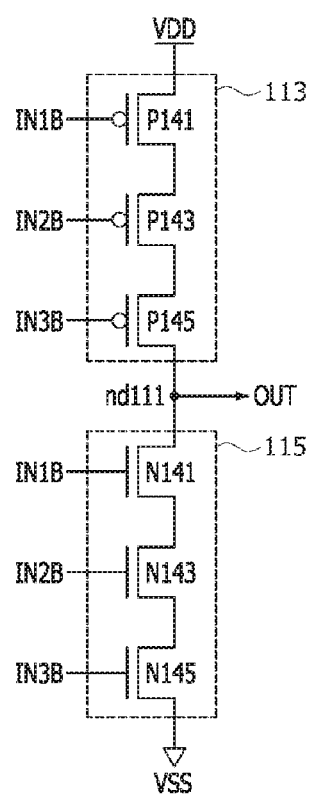
FIG. 11 is a circuit diagram illustrating an embodiment of a fourth pull-up driving circuit and a fourth pull-down driving circuit which are included in the logic circuit illustrated in FIG. 1.

FIG. 11 is a circuit diagram illustrating an embodiment of the fourth pull-up driving circuit 113 and the fourth pull-down driving circuit 115.

As illustrated in FIG. 11, the fourth pull-up driving circuit 113 may include PMOS transistors P141, P143, and P145. The PMOS transistors P141, P143, and P145 may be coupled in series between the terminal of the supply voltage VDD and the node nd111 from which the output signal OUT is outputted. The PMOS transistor P141 may be turned on when the first inverted input signal IN1B received from the first pull-up driving circuit 101 or the second pull-down driving circuit 107 is at a logic low level. The PMOS transistor P143 may be turned on when the second inverted input signal IN2B received from the second pull-up driving circuit 105 or the third pull-down driving circuit 111 is at a logic low level. The PMOS transistor P145 may be turned on when the third inverted input signal IN3B received from the third pull-up driving circuit 109 or the first pull-down driving circuit 103 is at a logic low level. The fourth pull-up driving circuit 113 may pull up the output signal OUT, outputted from the node nd111, to the supply voltage VDD through the PMOS transistors P141, P143, and P145 which are all turned on when the first inverted input signal IN1B, the second inverted input signal IN2B, and the third inverted input signal IN3B are all at a logic low level.

As illustrated in FIG. 11, the fourth pull-down driving circuit 115 may include NMOS transistors N141, N143, and N145. The NMOS transistors N141, N143, and N145 may be coupled in series between the node nd111 and the terminal of the ground voltage VSS. The NMOS transistor N141 may be turned on when the first inverted input signal IN113 received from the first pull-up driving circuit 101 or the second pull-down driving circuit 107 is at a logic high level. The NMOS transistor N143 may be turned on when the second inverted input signal IN2B received from the second pull-up driving circuit 105 or the third pull-down driving circuit 111 is at a logic high level. The NMOS transistor N145 may be turned on when the third inverted input signal IN3B received from the third pull-up driving circuit 109 or the first pull-down driving circuit 103 is at a logic high level. The fourth pull-down driving circuit 115 may pull down the output signal OUT, outputted from the node nd111, to the ground voltage VSS through the NMOS transistors N141, N143, and N145 which are all turned on when the first inverted input signal IN1B, the second inverted input signal IN2B, and the third inverted input signal IN3B are all at a logic high level.

Figure 12:
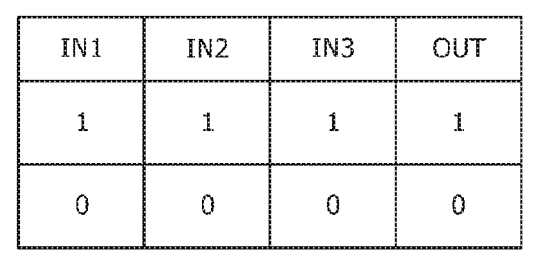

FIG. 12 is a table for describing the operations of the fourth pull-up driving circuit 113 and the fourth pull-down driving circuit 115 which are illustrated in FIG. 11. As illustrated in FIG. 12, the fourth pull-up driving circuit 113 may drive the output signal OUT to a logic high level "1," when the first input signal IN1, the second input signal IN2, and the third input signal IN3 are all at a logic high level "1." As illustrated in FIG. 12, the fourth pull-down driving circuit 115 may drive the output signal OUT to a logic low level, when the first input signal IN1, the second input signal IN2, and the third input signal IN3 are all at a logic low level "0."

FIG. 13 illustrates the operation of the logic circuit 10 which receives three input signals and performs an XOR operation on the received signals. The logic circuit 10 may pull up or pull down the output signal OUT according to the logic level combination of the first input signal IN1, the second input signal IN2, and the third input signal IN3 based on the configurations and operations described with reference to FIGS. 1 to 12, thereby rapidly performing an XOR operation.

Figure 14:
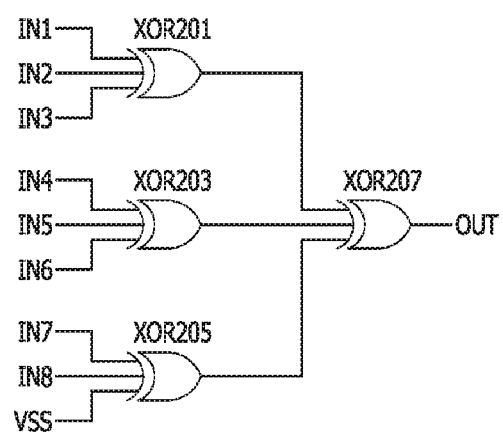
FIGS. 14 to 16 are circuit diagrams illustrating embodiments of logic circuits which receive eight input signals and perform an XOR operation.
Figure 15:
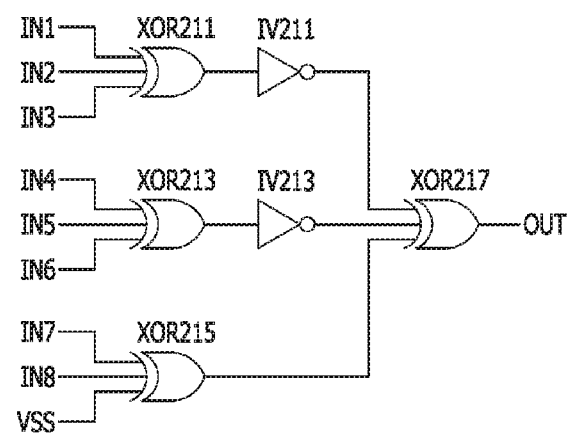
Figure 16:
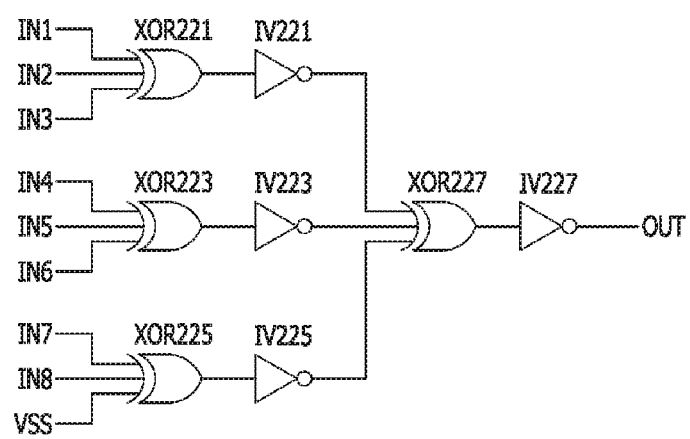

FIGS. 14 to 16 are circuit diagrams illustrating embodiments of logic circuits which receive eight input signals and perform an XOR operation on the received signals.

As illustrated in FIG. 14, a logic circuit 201 may include XOR gates XOR201, XOR203, XOR205, and XOR207. The XOR gate XO201 may receive a first input signal IN1, a second input signal IN2, and a third input signal IN3, and perform an XOR operation on the received signals. The XOR gate XOR203 may receive a fourth input signal IN4, a fifth input signal IN5, and a sixth input signal IN6, and perform an XOR operation on the received signals. The XOR gate XOR205 may receive a seventh input signal IN7, an eighth input signal IN8, and a ground voltage VSS, and perform an XOR operation on the received signals. The XOR gate XOR207 may receive an output signal of the XOR gate XOR201, an output signal of the XOR gate XOR203, and an output signal of the XOR gate XOR205, perform an XOR operation on the received signals, and output the output signal OUT. Each of the XOR gates XOR201, XOR203, XOR205, and XOR207 may be implemented by using the logic circuit 10 which receives three input signals and performs an XOR operation on the received signals as described with reference to FIGS. 1 to 12.

As illustrated in FIG. 15, a logic circuit 211 may include XOR gates XOR211, XOR213, XOR215, and XOR217 and inverters IV211 and IV213. The XOR gate XOR211 may receive the first input signal IN1, the second input signal IN2, and the third input signal IN3, and perform an XOR operation on the received signals. The inverter IV211 may invert and buffer an output signal of the XOR gate XOR211. The XOR gate XOR213 may receive the fourth input signal IN4, the fifth input signal IN5, and the sixth input signal IN6, and perform an XOR operation on the received signals. The inverter IV213 may invert and buffer an output signal of the XOR gate XOR213. The XOR gate XOR215 may receive the seventh input signal IN7, the eighth input signal IN8, and the ground voltage VSS, and perform an XOR operation on the received signals. The XOR gate XOR217 may receive an output signal of the inverter IV211, an output signal of the inverter IV213, and an output signal of the XOR gate XOR215, perform an XOR operation on the received signals, and output the output signal OUT. Each of the XOR gates XOR211, XOR213, XOR215, and XOR217 may be implemented by using the logic circuit 10 which receives three input signals and performs an XOR operation on the received signals as described with reference to FIGS. 1 to 12.

As illustrated in FIG. 16, a logic circuit 221 may include XOR gates XOR221, XOR223, XOR225, and XOR227 and inverters IV221, IV223, IV225, and IV227. The XOR gate XOR221 may receive the first input signal IN1, the second input signal IN2, and the third input signal IN3, and perform an XOR operation on the received signals. The inverter IV221 may invert and buffer an output signal of the XOR gate XOR221. The XOR gate XOR223 may receive the fourth input signal IN4, the fifth input signal IN5, and the sixth input signal IN6, and perform an XOR operation on the received signals. The inverter IV223 may invert and buffer an output signal of the XOR gate XOR223. The XOR gate XOR225 may receive the seventh input signal 11\17, the eighth input signal 1118, and the ground voltage VSS, and perform an XOR operation on the received signals. The inverter IV225 may invert and buffer an output signal of the XOR gate XOR225. The XOR gate XOR227 may receive an output signal of the inverter IV221, an output signal of the inverter IV223, and an output signal of the inverter IV225, and perform an XOR operation on the received signals. The inverter IV227 may invert and buffer an output signal of the XOR gate XOR227, and output the output signal OUT. Each of the XOR gates XOR221, XOR223, XOR225, and XOR227 may be implemented as the logic circuit 10 which receives three input signals and performs an XOR operation on the received signals as described with reference to FIGS. 1 to 12.

The logic circuits 201, 211, and 221 may receive eight input signals, and perform an XOR operation on the received signals. The output signals of the logic circuits 201 and 211 may be inverted and buffered to implement logic circuits which receive eight input signals and perform an XOR operation on the received signals. Furthermore, the inverter IV227 included in the logic circuit 221 may be removed to implement logic circuits which receive eight input signals and perform an XOR operation on the received signals.

While various embodiments have been described above, it will be understood by those skilled in the art that the described embodiments serve as examples only. Accordingly, the electronic device described herein should not be limited based on the described embodiments.

What is claimed is:

1. A logic circuit comprising:
   a first pull-up driving circuit configured to generate a first inverted input signal by inverting and buffering a first input signal, and configured to pull up an output signal to the first inverted input signal based on a second input signal and a third inverted input signal; and
   a first pull-down driving circuit configured to generate the third inverted input signal by inverting and buffering a third input signal, and configured to pull down the output signal to the third inverted input signal based on the first inverted input signal and the second input signal,
   wherein the first pull-up driving circuit comprises:
      a first inverter configured to generate the first inverted input signal by inverting and buffering the first input signal and configured to output the first inverted input signal to a first node, and
      a first p-type metal-oxide-semiconductor (PMOS) transistor and a second PMOS transistor coupled in series between the first node and a second node from which the output signal is outputted, wherein the first PMOS transistor is configured to be turned on based on the second input signal, and the second PMOS transistor is configured to be turned on based on the third inverted input signal.

2. The logic circuit of claim 1, wherein the first pull-down driving circuit comprises:
   a second inverter configured to generate the third inverted input signal by inverting and buffering the third input signal and configured to output the third inverted input signal to a third node; and
   a first n-type metal-oxide-semiconductor (NMOS) transistor and a second NMOS transistor coupled in series between the third node and the second node, wherein the first NMOS transistor is configured to be turned on based on the first inverted input signal, and the second NMOS transistor is configured to be turned on based on the second input signal.

3. The logic circuit of claim 1, further comprising:
   a second pull-up driving circuit configured to generate a second inverted input signal by inverting and buffering the second input signal, and configured to pull up the output signal to the second inverted input signal based on the third input signal and the first inverted input signal; and
   a second pull-down driving circuit configured to generate the first inverted input signal by inverting and buffering the first input signal, and configured to pull down the output signal to the first inverted input signal based on the second inverted input signal and the third input signal.

4. The logic circuit of claim 3, further comprising:
   a third pull-up driving circuit configured to generate the third inverted input signal by inverting and buffering the third input signal, and configured to pull up the output signal to the third inverted input signal based on the first input signal and the second inverted input signal; and
   a third pull-down driving circuit configured to generate the second inverted input signal by inverting and buffering the second input signal, and configured to pull down the output signal to the second inverted input signal based on the third inverted input signal and the first input signal.

5. The logic circuit of claim 4, further comprising:
   a fourth pull-up driving circuit configured to pull up the output signal based on the first inverted input signal, the second inverted input signal, and the third inverted input signal; and
   a fourth pull-down driving circuit configured to pull down the output signal based on the first inverted input signal, the second inverted input signal, and the third inverted input signal.

* * * * *